(12) United States Patent
Ye et al.

(10) Patent No.: US 11,330,728 B2
(45) Date of Patent: May 10, 2022

(54) HANDLE EXTENSION STRUCTURE AND ELECTRONIC DEVICE CASING

(71) Applicant: PEGATRON CORPORATION, Taipei (TW)

(72) Inventors: Long-Sing Ye, Taipei (TW); Yao-Hsien Huang, Taipei (TW); Yu-Wen Liu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 45 days.

(21) Appl. No.: 17/088,105

(22) Filed: Nov. 3, 2020

(65) Prior Publication Data

US 2021/0153368 A1    May 20, 2021

(30) Foreign Application Priority Data

Nov. 19, 2019  (TW) .................................. 108141969

(51) Int. Cl.
  *H05K 5/02*  (2006.01)
  *H05K 7/14*  (2006.01)

(52) U.S. Cl.
  CPC ........... *H05K 5/023* (2013.01); *H05K 5/0221* (2013.01); *H05K 7/1488* (2013.01)

(58) Field of Classification Search
  None
  See application file for complete search history.

(56) References Cited

U.S. PATENT DOCUMENTS

| | | | | |
|---|---|---|---|---|
| 4,589,162 A | * | 5/1986 | Manz ...................... | H05K 5/023 16/429 |
| 5,450,735 A | * | 9/1995 | Esaki ...................... | E05C 3/042 292/DIG. 31 |
| 5,938,248 A | * | 8/1999 | Vickers .................... | E05B 5/00 292/34 |
| 6,203,075 B1 | * | 3/2001 | Wells, Jr ................. | B65D 45/24 292/113 |
| 6,351,976 B1 | * | 3/2002 | Chen ....................... | E05B 13/10 292/336.3 |
| 6,547,289 B1 | * | 4/2003 | Greenheck .............. | E05B 65/46 292/200 |
| 6,579,029 B1 | * | 6/2003 | Sevde ................... | H05K 7/1414 403/321 |

(Continued)

FOREIGN PATENT DOCUMENTS

| | | |
|---|---|---|
| CN | 201162743 | 12/2008 |
| CN | 201813636 | 4/2011 |
| CN | 205353893 | 6/2016 |

*Primary Examiner* — Xanthia C Cunningham
(74) *Attorney, Agent, or Firm* — J.C. Patents (57) ABSTRACT

A handle extension structure includes a connection assembly and an operation assembly. The connection assembly has a first end and a second end opposite to each other. The operation assembly is slidably disposed at the connection assembly. The operation assembly includes an extension element and a grip element. The extension element has a first end portion and a second end portion opposite to each other. The first end portion is slidably disposed between the first end and the second end. The grip element is pivoted to the second end portion. An electronic device casing includes a body, a movable apparatus, and the handle extension structure. The handle extension structure is pivoted to the movable apparatus through the connection assembly.

18 Claims, 10 Drawing Sheets

(56) References Cited

U.S. PATENT DOCUMENTS

| | | | | |
|---|---|---|---|---|
| 6,918,274 B2* | 7/2005 | Gladden | ............... | E05B 13/002 |
| | | | | 292/DIG. 31 |
| 7,649,750 B2* | 1/2010 | Lee | ................... | H05K 7/1405 |
| | | | | 361/801 |
| 7,819,440 B2* | 10/2010 | Schwickerath | ......... | E05B 81/36 |
| | | | | 292/201 |
| 8,498,104 B2* | 7/2013 | Lin | ................... | G06F 1/187 |
| | | | | 361/679.31 |
| 8,720,237 B2* | 5/2014 | Williams | ................... | E05C 3/24 |
| | | | | 292/216 |
| 8,867,195 B2* | 10/2014 | Tsubota | ............... | H05K 7/1414 |
| | | | | 361/740 |
| 9,203,188 B1* | 12/2015 | Siechen | ........... | H01R 13/62994 |
| 9,554,480 B2* | 1/2017 | Freeman | .............. | H05K 5/0247 |
| 9,609,778 B1* | 3/2017 | Spencer | ................ | G11B 33/128 |
| 9,730,356 B2* | 8/2017 | Franz | .................. | G11B 33/1426 |
| 9,795,052 B2* | 10/2017 | Hsiao | ...................... | H05K 7/18 |
| 10,070,549 B2* | 9/2018 | Su | ....................... | H05K 7/1409 |
| 10,178,791 B1* | 1/2019 | Kho | ..................... | H05K 7/1487 |
| 10,206,302 B2* | 2/2019 | Liao | ....................... | G06F 1/183 |
| 10,264,698 B2* | 4/2019 | Kho | ..................... | H05K 7/1492 |
| 10,285,291 B1* | 5/2019 | Lam | ...................... | H05K 5/0295 |
| 10,392,830 B2* | 8/2019 | Helsley | ................ | E05B 13/002 |
| 10,396,497 B1* | 8/2019 | Bame | ..................... | H05K 7/1412 |
| 10,499,527 B2* | 12/2019 | Liao | .................... | H05K 7/1489 |
| 10,563,429 B1* | 2/2020 | Bailey | .................. | E05B 35/008 |
| 10,584,514 B2* | 3/2020 | Leong | ................ | E05B 47/0657 |
| 10,681,835 B2* | 6/2020 | Moore | ................. | H01Q 1/2258 |
| 10,765,028 B1* | 9/2020 | Beall | ..................... | H05K 7/1489 |
| 2006/0215373 A1* | 9/2006 | Joist | ..................... | H05K 7/1409 |
| | | | | 361/726 |
| 2007/0240463 A1* | 10/2007 | Antonucci | ............ | E05B 1/0092 |
| | | | | 70/208 |
| 2008/0047308 A1* | 2/2008 | Stuckey | .............. | E05B 17/0062 |
| | | | | 70/215 |
| 2009/0181568 A1* | 7/2009 | Chiang | ................ | H05K 7/1409 |
| | | | | 439/310 |
| 2010/0296791 A1* | 11/2010 | Makrides-Saravanos | .................... | |
| | | | | G02B 6/4455 |
| | | | | 385/135 |
| 2012/0248952 A1* | 10/2012 | Gong | ................... | H05K 7/1494 |
| | | | | 312/244 |
| 2013/0130528 A1* | 5/2013 | Jun | ...................... | H05K 7/1409 |
| | | | | 439/160 |
| 2015/0156912 A1* | 6/2015 | Liang | .................. | H05K 7/1489 |
| | | | | 292/164 |
| 2015/0296649 A1* | 10/2015 | Wang | .................. | H05K 7/1409 |
| | | | | 403/326 |
| 2015/0327389 A1* | 11/2015 | Westphall | ........ | H01R 13/62988 |
| | | | | 361/748 |
| 2016/0150659 A1* | 5/2016 | Chen | ....................... | E05C 1/145 |
| | | | | 292/126 |
| 2016/0157377 A1* | 6/2016 | Nishiyama | ........... | H05K 7/1489 |
| | | | | 361/679.58 |
| 2017/0150634 A1* | 5/2017 | Huang | ................ | H05K 7/1489 |
| 2017/0329371 A1* | 11/2017 | Schmidtke | ............... | H04L 49/15 |
| 2019/0190240 A1* | 6/2019 | Kroushl | ................... | H02B 1/46 |

* cited by examiner

HANDLE EXTENSION STRUCTURE AND ELECTRONIC DEVICE CASING

CROSS-REFERENCE TO RELATED APPLICATION

This application claims the priority benefit of Taiwan application serial no. 108141969, filed on Nov. 19, 2019. The entirety of the above-mentioned patent application is hereby incorporated by reference herein and made a part of this specification.

BACKGROUND

Technical Field

The application relates to a handle extension structure and an electronic device casing, and more particularly, to a handle extension structure and an electronic device casing having the handle extension structure.

Description of Related Art

A conventional server product mainly includes a body and a plurality of movable apparatuses movably disposed in the body. For the convenience of pulling of the movable apparatuses, each movable apparatus is generally provided with a handle. However, the design of the conventional handle may easily cause an injury to an operator.

SUMMARY

The application provides a handle extension structure and an electronic device casing capable of reducing the chance of causing an injury to an operator as compared to a conventional handle design.

A handle extension structure of the application includes a connection assembly and an operation assembly. The connection assembly has a first end and a second end opposite to each other. The operation assembly is slidably disposed at the connection assembly. The operation assembly includes an extension element and a grip element. The extension element has a first end portion and a second end portion opposite to each other. The first end portion is slidably disposed between the first end and the second end. The grip element is pivoted to the second end portion. When the first end portion of the extension element is located at the first end, a portion of the grip element is located in the connection assembly, a total length of the connection assembly and the operation assembly is a first length, and the second end portion is located between the first end and the second end. When the first end portion slides to the second end to locate the grip element outside the connection assembly, the total length of the connection assembly and the operation assembly is a second length, the second end portion moves out of the second end, and the grip element is adapted to rotate relative to the second end portion. The second length is greater than the first length.

An electronic device casing of the application includes a body, a movable apparatus, and a handle extension structure. The movable apparatus is adapted to be assembled on the body. The handle extension structure includes a connection assembly and an operation assembly. The connection assembly has a first end and a second end opposite to each other, and is adapted to be pivoted on the movable apparatus. The operation assembly is slidably disposed at the connection assembly. The operation assembly includes an extension element and a grip element. The extension element has a first end portion and a second end portion opposite to each other. The first end portion is slidably disposed between the first end and the second end. The grip element is pivoted to the second end portion. When the first end portion of the extension element is located at the first end, a portion of the grip element is located in the connection assembly, a total length of the connection assembly and the operation assembly is a first length, and the second end portion is located between the first end and the second end. When the first end portion slides to the second end to locate the grip element outside the connection assembly, the total length of the connection assembly and the operation assembly is a second length, the second end portion moves out of the second end, and the grip element is adapted to rotate relative to the second end portion. The second length is greater than the first length.

Based on the above, in the handle extension structure and the electronic device casing according to the embodiments of the application, with the handle length increased through the extension element, a force can be conveniently applied during pulling, and the grip element may be rotated relative to the second end portion to provide different force application patterns, thereby reducing the probability of accidentally causing an injury to an operator and consequently increasing the operation safety.

To make the features and advantages of the application clear and easy to understand, the following gives a detailed description of embodiments with reference to accompanying drawings.

DESCRIPTION OF THE EMBODIMENTS

Figure 1:
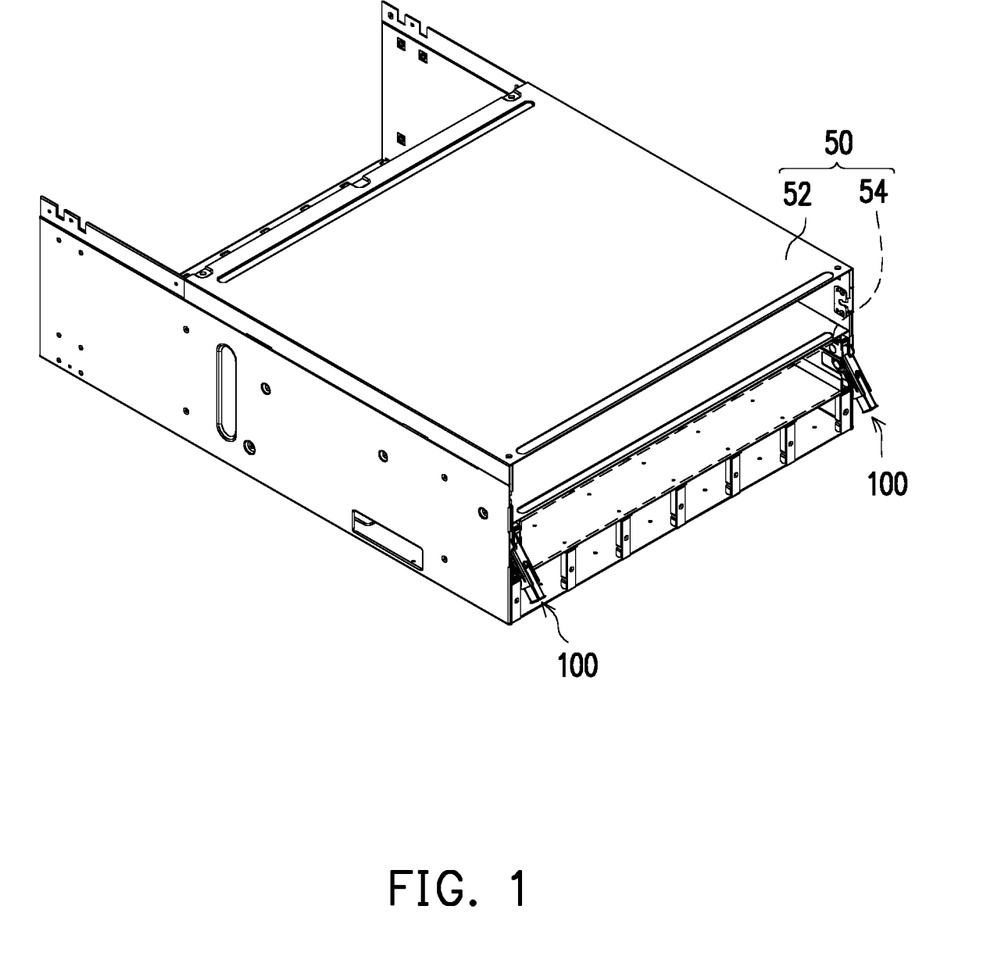
FIG. 1 is a schematic perspective view of an electronic device casing according to an embodiment of the application.
Figure 2A:
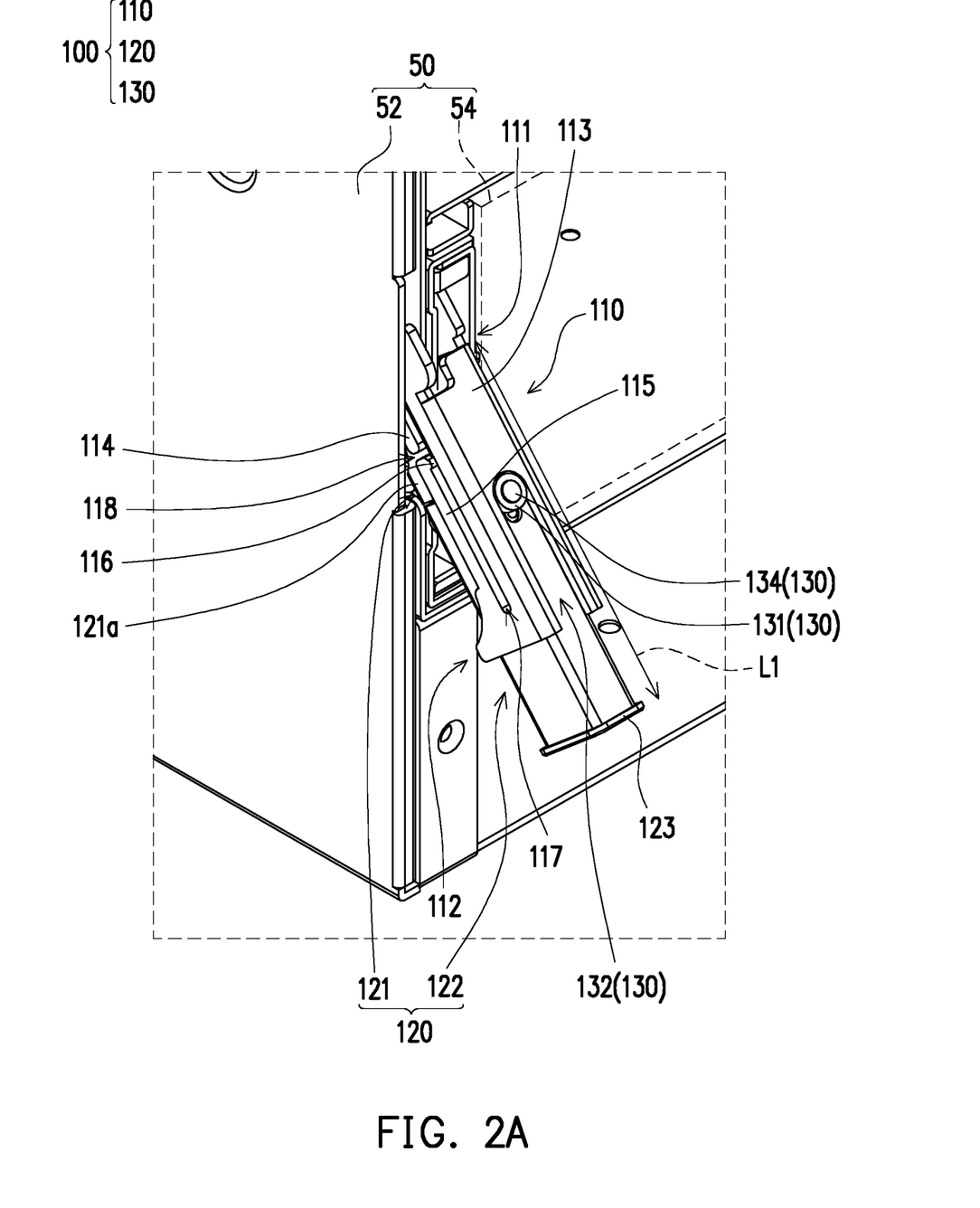
FIGS. 2A to 2D are schematic views illustrating an operation flow of a handle extension structure of an electronic device casing according to an embodiment of the application.

FIG. 1 is a schematic perspective view of an electronic device casing according to an embodiment of the application. FIGS. 2A to 2D are schematic views illustrating an operation flow of a handle extension structure of an electronic device casing according to an embodiment of the application. FIG. 3 is a schematic exploded view of a handle extension structure according to an embodiment of the application. Referring to FIG. 1, FIG. 2A, and FIG. 3, an electronic device casing 50 includes a body 52, a movable apparatus 54, and a handle extension structure 100. The body 52 is, for example but not limited to, a server cabinet. The movable apparatus 54 may be assembled to the body 52 and is, for example but not limited to, a host that may be inserted into the body 52. The body 52 may be inserted with a plurality of movable apparatuses 54. Opposite sides of each movable apparatus 54 are symmetrically provided with the handle extension structures 100.

The handle extension structure 100 of the present embodiment includes a connection assembly 110 and an operation assembly 120. The connection assembly 110 has a first end 111 and a second end 112 opposite to each other. The operation assembly 120 is slidably disposed at the connection assembly 110. The handle extension structure 100 is pivoted to the movable apparatus 54 through the connection assembly 110. The operation assembly 120 includes an extension element 121 and a grip element 122. The extension element 121 has a first end portion 121a and a second end portion 121b opposite to each other. The first end portion 121a of the extension element 121 is slidably disposed between the first end 111 of the connection assembly 110 and the second end 112 of the connection assembly 110, so that the operation assembly 120 may slide back and forth relative to the connection assembly 110. The grip element 122 is pivoted to the second end portion 121b of the extension element 121, so that the grip element 122 may rotate relative to the extension element 121.

Figure 2B:
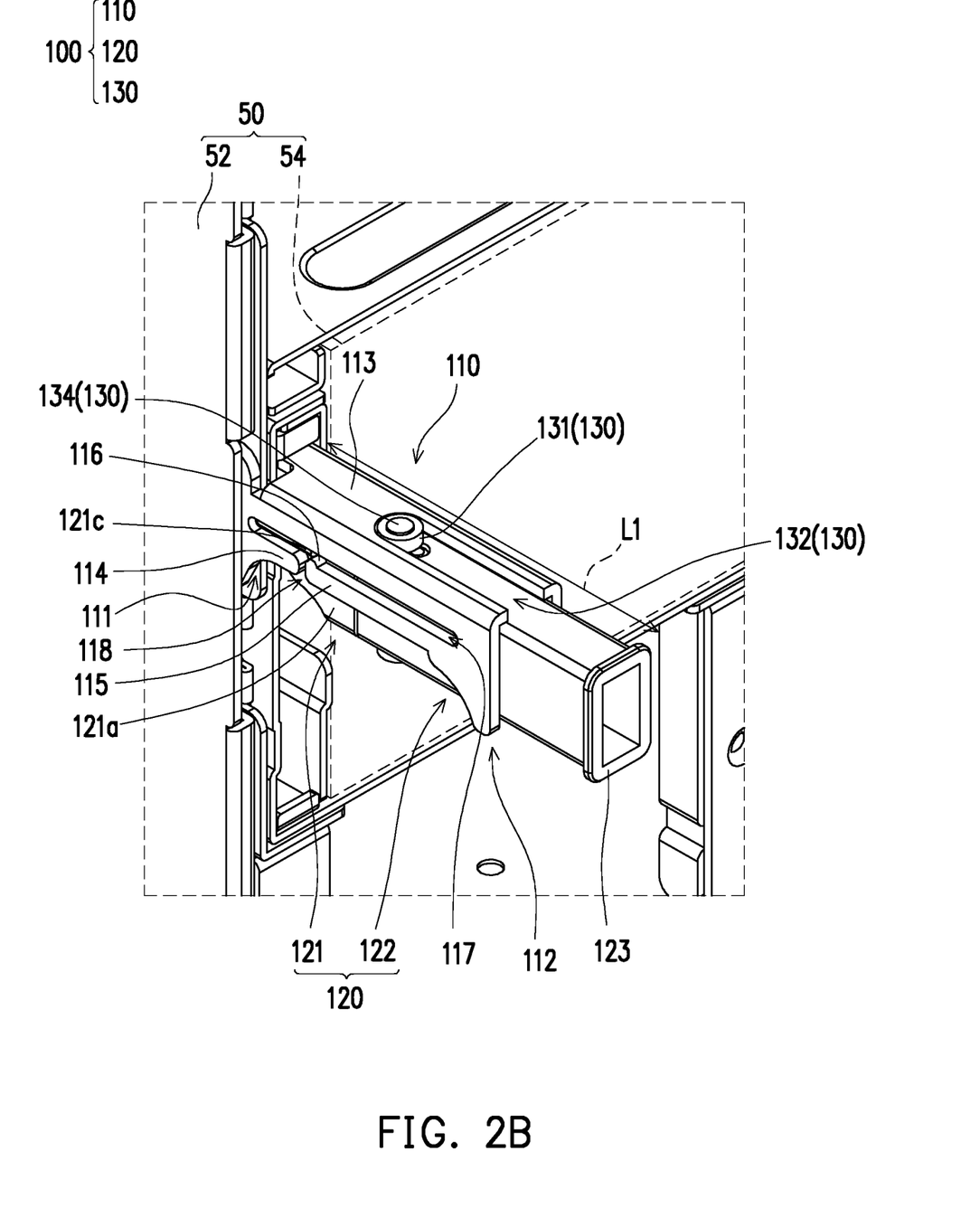
Figure 3:
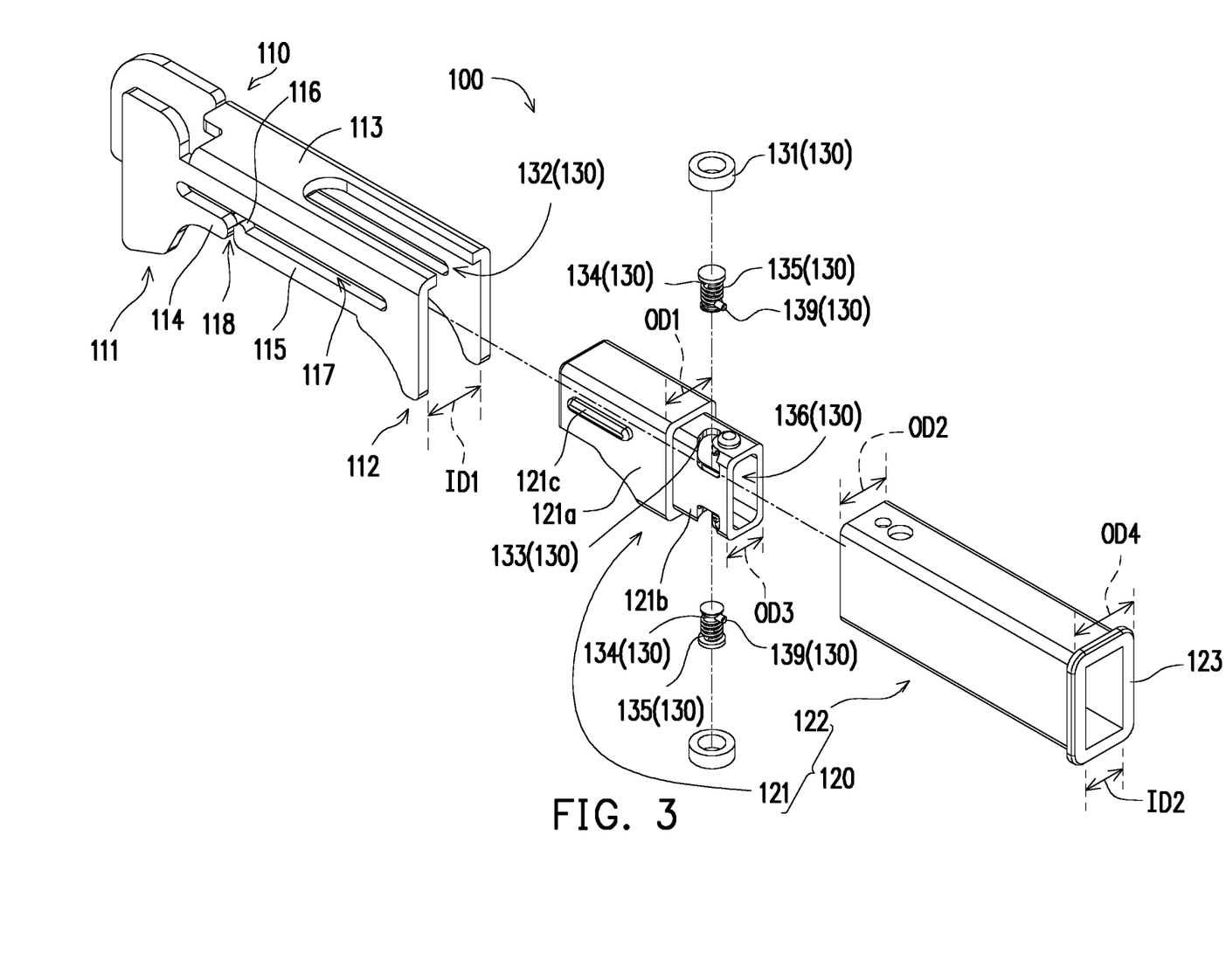
FIG. 3 is a schematic exploded view of a handle extension structure according to an embodiment of the application.

When the first end portion 121a of the extension element 121 is located at the first end 111 of the connection assembly 110 as shown in FIGS. 2A and 2B, a portion of the grip element 122 is located in the connection assembly 110, and a total length of the connection assembly 110 and the operation assembly 120 is a first length L1. The second end portion 121b is located between the first end 111 of the connection assembly 110 and the second end 112 of the connection assembly 110.

Figure 2C:
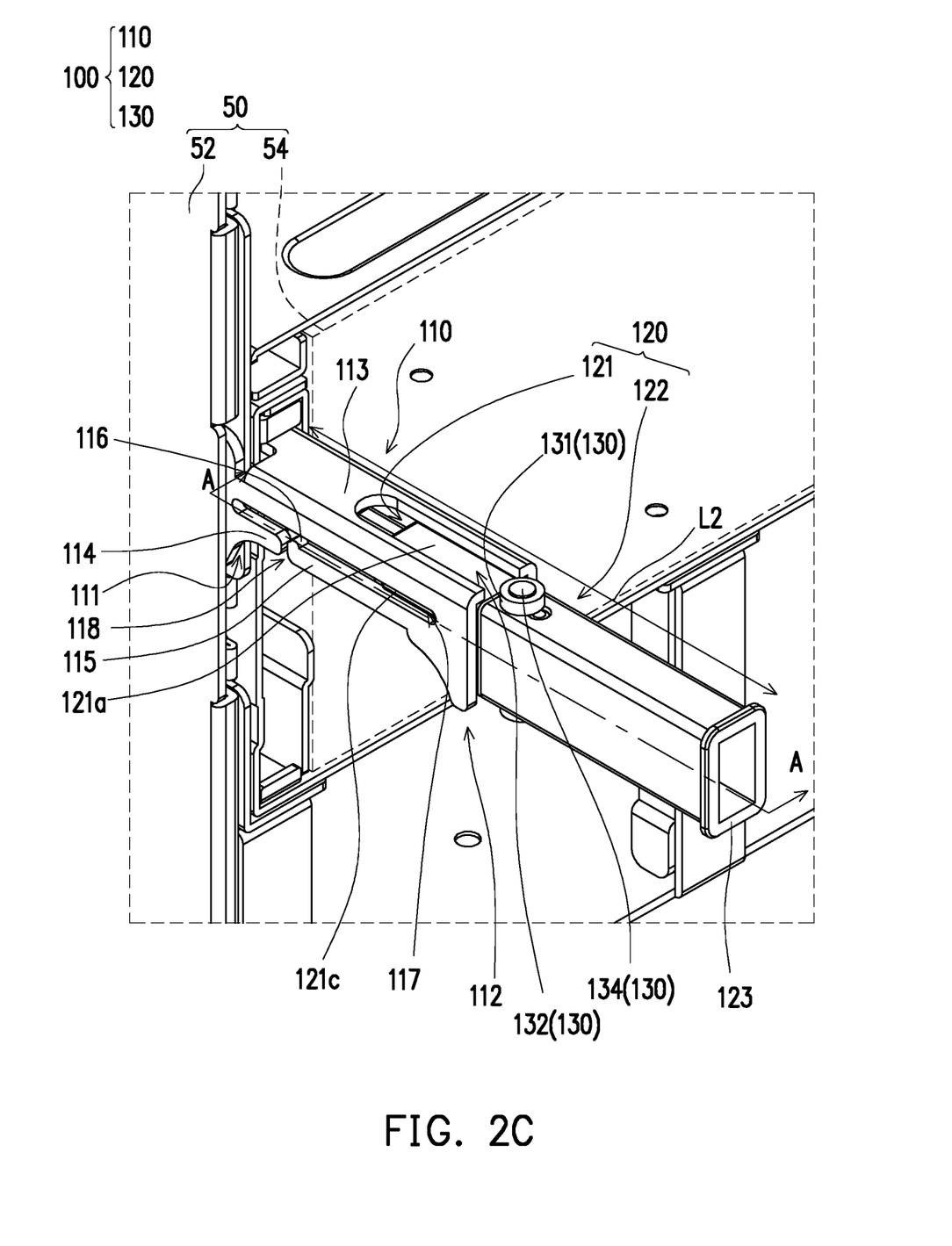
Figure 2D:
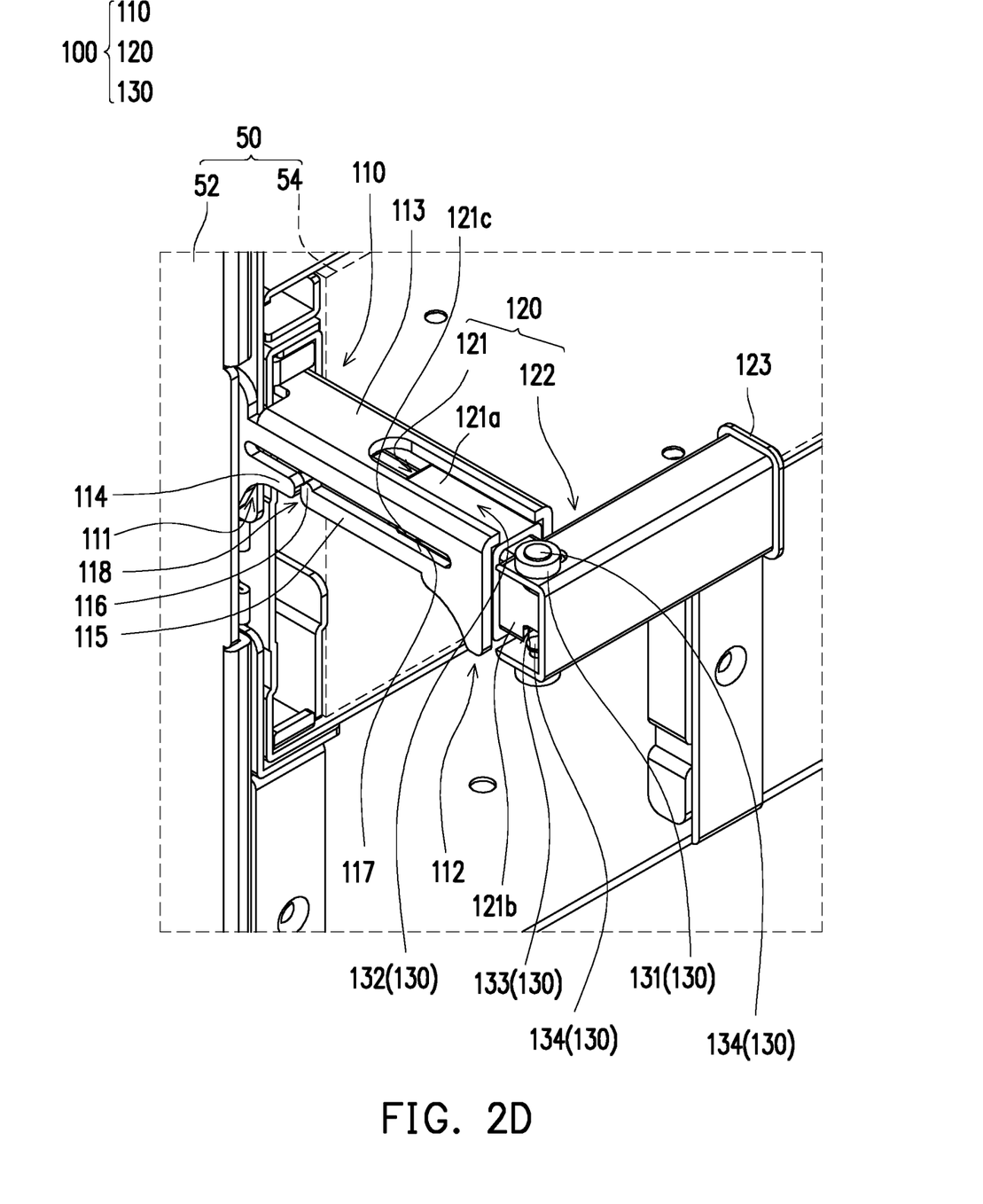

When the first end portion 121a of the extension element 121 slides toward the second end 112 as shown in FIG. 2C to locate the grip element 122 outside the connection assembly 110, the total length of the connection assembly 110 and the operation assembly 120 is a second length L2. The second end portion 121b moves out of the second end 112 of the connection assembly 110. At this moment, the grip element 122 may rotate relative to the second end portion 121b to be parallel to the extension element 121 as shown in FIG. 2C or perpendicular to the extension element 121 as shown in FIG. 2D. In a state shown in FIG. 2D, the grip element 122 may be gripped by an operator and applied with a force to push and pull the movable apparatus 54.

In other words, the handle extension structure 100 of the application is a hidden structure. When the operator does not need to pull the movable apparatus 54, the handle extension structure 100 may be stored in a state shown in FIG. 2A, so that the operation assembly 120 may be partially hidden in the connection assembly 110. Accordingly, it is possible to achieve the effects of reducing the probability of an accidental injury to the operator and helping to improve the operation safety.

Specifically, referring to FIG. 1, FIG. 2B, and FIG. 3, the connection assembly 110 includes a body portion 113, at least one first slot arm 114, at least one second slot arm 115, and at least one positioning portion 116. The body portion 113 has a first end 111 and a second end 112. The first slot arm 114 extends from the first end 111 toward the second end 112. The second slot arm 115 extends from the second end 112 toward the first end 111. A sliding slot 117 is defined among the body portion 113, the first slot arm 114, and the second slot arm 115. The first slot arm 114 and the second slot arm 115 are opposite to each other and are separated by a gap 118. The gap 118 communicates with the sliding slot 117. The positioning portion 116 is connected to one of the first slot arm 114 and the second slot arm 115 and is positioned beside the gap 118. In the present embodiment, the positioning portion 116 is connected to, for example but not limited to, the second slot arm 115. The extension element 121 further includes at least one sliding block 121c. The sliding block 121c protrudes from the first end portion 121a of the extension element 121 and is slidably disposed at the sliding slot 117. When the positioning portion 116 abuts against the sliding block 121c, the positioning portion 116 may position the operation assembly 120 relative to the connection assembly 110.

In the present embodiment, for example, there are two first slot arms 114, two second slot arms 115, two positioning portions 116, two sliding slots 117, two gaps 118, and two sliding blocks 121c, which are disposed on opposite sides of the connection assembly 110, respectively. In other embodiments, the number of the first slot arm, the second slot arm, the positioning portion, the sliding slot, the gap, and the sliding block is not limited thereto.

On the other hand, the operation assembly 120 further includes a protrusion element 123. The protrusion element 123 is located at an end of the grip element 122 opposite to a location where the grip element 122 is pivoted to the second end portion 121b. By means of the protrusion element 123, the operator may conveniently apply a force to pull the operation assembly 120 from a state shown in FIG. 2B to a state shown in FIG. 2C.

Referring to FIG. 3, a first inner diameter ID1 of the connection assembly 110 is equal to a first outer diameter OD1 of the first end portion 121a of the extension element 121. A second outer diameter OD2 of the grip element 122 is equal to the first outer diameter OD1 of the first end portion 121a of the extension element 121. A third outer diameter OD3 of the second end portion 121b of the extension element 121 is equal to a second inner diameter ID2 of the grip element 122. A fourth outer diameter OD4 of the protrusion element 123 is greater than the second outer diameter OD2 of the grip element 122. That is, ID1=OD1=OD2; OD3=ID2; OD4>OD2. In other words, the first end portion 121a of the extension element 121 is slidably disposed inside the connection assembly 110, and the grip element 122 is pivoted outside the second end portion 121b of the extension element 121.

Figure 4:
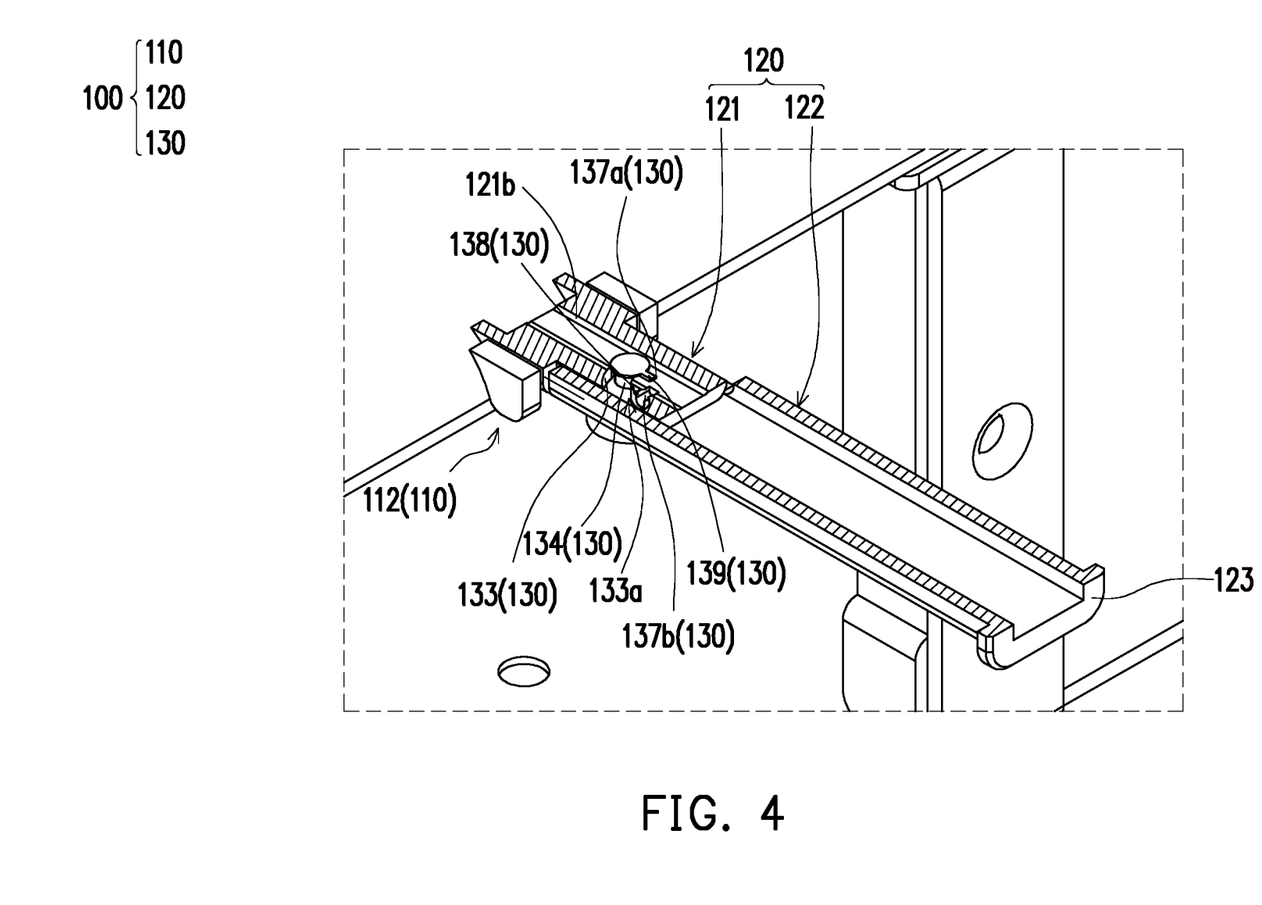
FIG. 4 is a cross-sectional perspective view taken along a line A-A of FIG. 2C.
Figure 5A:
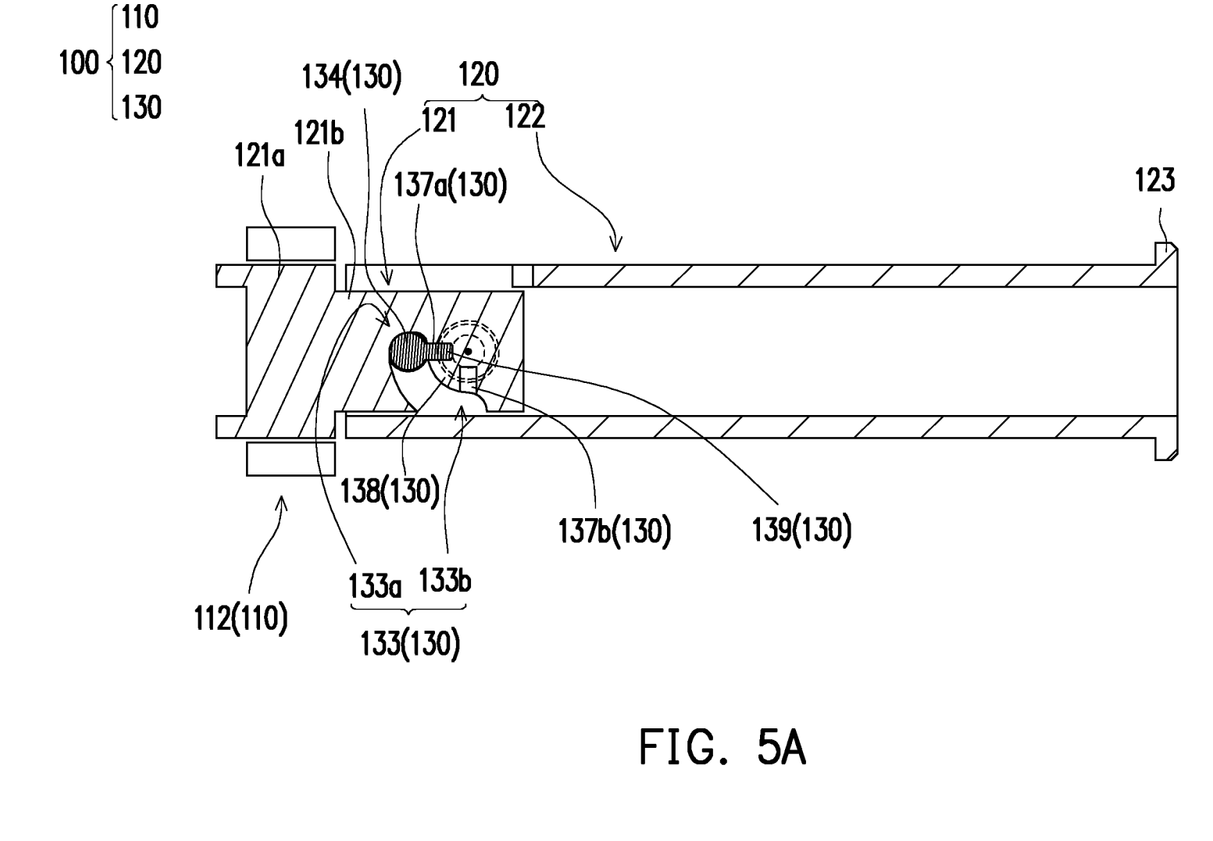
FIGS. 5A to 5C are schematic views illustrating an operation flow of a grip element of FIG. 2C.
Figure 5B:
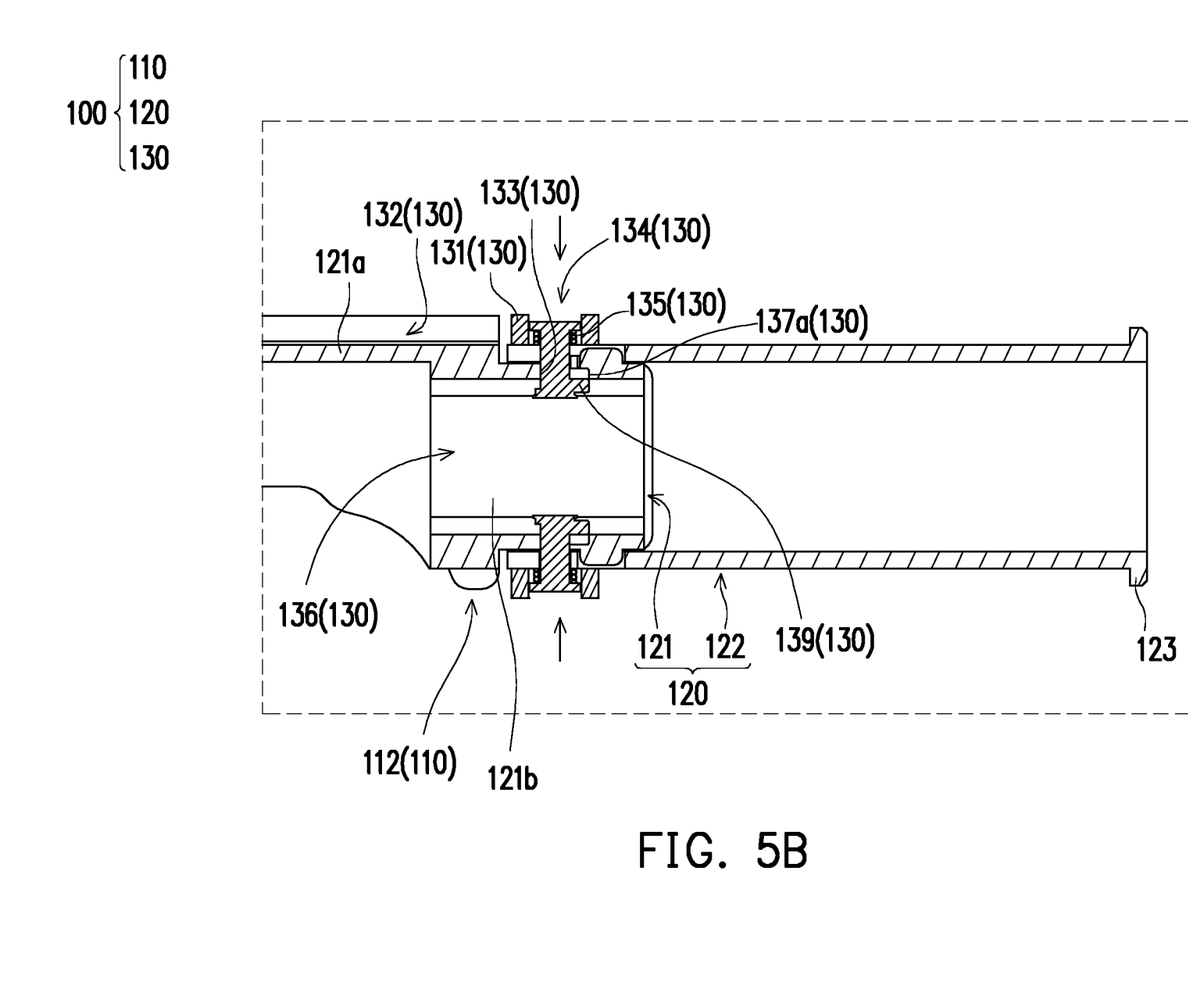
Figure 5C:
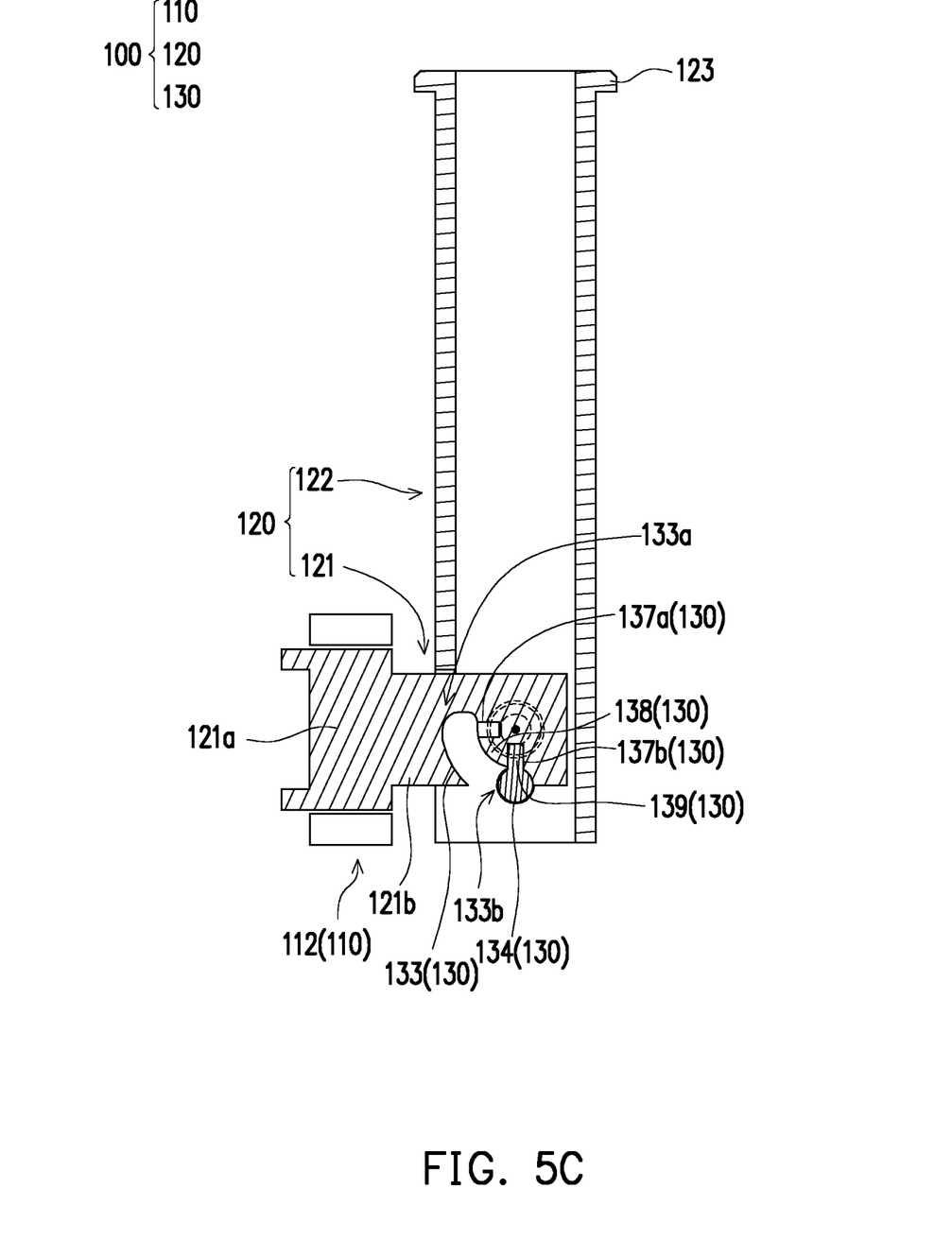

FIG. 4 is a cross-sectional perspective view taken along a line A-A of FIG. 2C. FIGS. 5A to 5C are schematic views illustrating an operation flow of a grip element of FIG. 2C. The grip element 122 has been moved out of the second end 112 of the connection assembly 110 in FIGS. 5A to 5C. Referring to FIGS. 3, 4, 5A, and 5B, the handle extension structure 100 further includes a positioning structure 130. The positioning structure 130 is configured to change a position of the grip element 122 relative to the connection assembly 110.

In detail, the positioning structure 130 includes at least one positioning block 131 and at least one positioning slot 132. The positioning block 131 is disposed at the grip element 122 of the operation assembly 120. The positioning slot 132 is disposed at the connection assembly 110 and may receive the positioning block 131 to change the position of the grip element 122 relative to the connection assembly 110. When the positioning block 131 is located in the positioning slot 132, the grip element 122 cannot rotate relative to the extension element 121.

In the present embodiment, the number of the positioning slots 132 includes, but is not limited to, one, and the positioning slot is provided on the top of the connection assembly 110. The number of the positioning blocks 131 includes, but is not limited to, two, and the positioning blocks are disposed on opposite sides of the grip element 122, respectively. In other embodiments, the numbers and positions of the positioning blocks and the positioning slots are not limited thereto.

In the present embodiment, the positioning structure 130 further includes at least one guide arc portion 133 and at least one pressing element 134. The guide arc portion 133 is disposed at the second end portion 121b of the extension element 121. The pressing element 134 is disposed at the grip element 122 of the operation assembly 120 and movably penetrates the guide arc portion 133, so that the grip element 122 is selectively adapted to rotate relative to the second end portion 121b.

Furthermore, the guide arc portion 133 includes a first tail end 133a and a second tail end 133b. The first tail end 133a and the second tail end 133b are different from each other by 90 degrees, so that the grip element 122 may rotate for 90 degrees relative to the extension element 121.

With continued reference to FIGS. 3, 4, 5A, and 5B, the pressing element 134 is slidably disposed at the grip element 122 of the operation assembly 120. The positioning structure 130 further includes at least one restoring member 135, an escape space 136, at least one first recessed portion 137a, at least one second recessed portion 137b, at least one stop portion 138, and at least one locking portion 139.

The restoring member 135 abuts between the pressing element 134 and the grip element 122. The escape space 136 is defined inside the second end portion 121b of the extension element 121 and communicates with the guide arc portion 133. The first recessed portion 137a is disposed at the second end portion 121b of the extension element 121, and is connected to the escape space 136 and the guide arc portion 133. The first recessed portion 137a extends from the guide arc portion 133 to the location where the grip element 122 and the second end portion 121b of the extension element 121 are pivoted. The second recessed portion 137b is disposed at the second end portion 121b of the extension element 121, and is connected to the escape space 136 and the guide arc portion 133. The second recessed portion 137b extends from the guide arc portion 133 to the location where the grip element 122 and the second end portion 121b of the extension element 121 are pivoted. The first recessed portion 137a and the second recessed portion 137b are perpendicular to each other. A stop portion 138 is defined between the first recessed portion 137a and the second recessed portion 137b, and the stop portion 138 is adjacent to the guide arc portion 133. The locking portion 139 is disposed at the pressing element 134, extends toward the location where the grip element 122 and the second end portion 121b of the extension element 121 are pivoted, and may move with the pressing element 134.

When the operator has not pressed the pressing element 134 with a force yet, the restoring member 135 is configured to move the pressing element 134 in a direction opposite to the grip element 122, the locking portion 139 is locked to the first recessed portion 137a as shown in FIG. 5A, and the stop portion 138 is located on a moving path of the locking portion 139 and stops the locking portion 139. At this moment, the grip element 122 is parallel to the connection assembly 110. When the operator applies a force to the pressing element 134 to deform the restoring member 135 as shown in FIG. 5B, the locking portion 139 moves from the first recessed portion 137a into the escape space 136, and the stop portion 138 moves out of the moving path of the locking portion 139 and no longer stops the locking portion 139, as shown in FIG. 5C. Accordingly, the operator may rotate the grip element 122 to rotate the grip element 122 to a position shown in FIG. 2D relative to the extension element 121, so that the operator may use the grip element 122 to pull out the movable apparatus 54.

In the present embodiment, the number of the restoring members 135, the first recessed portions 137a, the second recessed portions 137b, the stop portions 138, and the locking portions 139 is, for example but not limited to, two. The first recessed portion 137a, the second recessed portion 137b, and the stop portion 138 are, for example but not limited to, disposed on opposite sides of the extension element 121. The restoring member 135 and the locking portion 139 are, for example but not limited to, disposed on opposite sides of the grip element 122. In other embodiments, the numbers and positions of the restoring members, the first recessed portions, the second recessed portions, the stop portions, and the locking portions are not limited thereto.

Based on the foregoing, in the handle extension structure and the electronic device casing according the embodiments of the application, when the first end portion of the extension element is located at the first end, the total length of the connection assembly and the operation assembly is the first length, and the second end portion is located between the first end and the second end. When the first end portion slides to the second end, the total length of the connection assembly and the operation assembly is the second length, the second end portion moves out of the second end, and the grip element is adapted to rotate relative to the second end portion, the second length being greater than the first length. Accordingly, the handle length is increased by the extension element, a force can be conveniently applied during pulling, and the grip element may be rotated relative to the second end portion to provide different force application patterns, thereby reducing the probability of accidental injuries to an operator and consequently increasing the operation safety.

Although the application is described with reference to the above embodiments, the embodiments are not intended to limit the application. A person of ordinary skill in the art may make variations and modifications without departing from the spirit and scope of the application. Therefore, the protection scope of the application should be subject to the appended claims.

What is claimed is:
1. A handle extension structure, comprising:
a connection assembly, comprising a first end and a second end opposite to each other; and
an operation assembly, slidably disposed at the connection assembly and comprising:
an extension element, comprising a first end portion and a second end portion opposite to each other, the first end portion being slidably disposed between the first end and the second end; and
a grip element, pivoted to the second end portion,
wherein when the first end portion of the extension element is located at the first end, a portion of the grip element is located in the connection assembly, a total length of the connection assembly and the operation assembly is a first length, and the second end portion is located between the first end and the second end, and
when the first end portion slides to the second end to locate the grip element outside the connection assembly, the total length of the connection assembly and the operation assembly is a second length, the second end portion moves out of the second end, and the grip element is adapted to rotate relative to the second end portion, the second length being greater than the first length.

2. The handle extension structure according to claim 1, wherein the connection assembly comprises a body portion, at least one first slot arm, at least one second slot arm, and at least one positioning portion, the body portion comprises the first end and the second end opposite to each other, the first slot arm extends from the first end to the second end, the second slot arm extends from the second end to the first end, a sliding slot is defined among the body portion, the first slot arm and the second slot arm, the first slot arm and the second slot arm are opposite to each other and are separated by a gap, the gap communicates with the sliding slot, and the positioning portion is connected to one of the first slot arm and the second slot arm and is located beside the gap, wherein the extension element further comprises at least one sliding block, the at least one sliding block protrudes from the first end portion and is slidably disposed at the sliding slot, and the positioning portion is adapted to abut against the sliding block to position the operation assembly relative to the connection assembly.

3. The handle extension structure according to claim 1, wherein a first inner diameter of the connection assembly is equal to a first outer diameter of the first end portion of the extension element, and a second outer diameter of the grip element is equal to a first outer diameter of the connection assembly.

4. The handle extension structure according to claim 3, wherein a third outer diameter of the second end portion of the extension element is equal to a second inner diameter of the grip element.

5. The handle extension structure according to claim 3, wherein the operation assembly further comprises a protrusion element, and the protrusion element is located at an end of the grip element opposite to a location where the grip element is pivoted to the second end portion, a fourth outer diameter of the protrusion element being greater than the second outer diameter of the grip element.

6. The handle extension structure according to claim 1, further comprising:
a positioning structure, configured to change a position of the grip element relative to the connection assembly.

7. The handle extension structure according to claim 6, wherein the positioning structure comprises:
at least one positioning block, disposed at the grip element; and
at least one positioning slot, disposed at the connection assembly, and adapted to receive the positioning block to change the position of the grip element relative to the connection assembly.

8. The handle extension structure according to claim 6, wherein the positioning structure comprises:
at least one guide arc portion, disposed at the second end portion of the extension element; and
at least one pressing element, disposed at the grip element and movably penetrating the guide arc portion, so that the grip element is selectively adapted to rotate relative to the second end portion.

9. The handle extension structure according to claim 8, wherein the pressing element is slidably disposed at the grip element, and the positioning structure further comprises:
at least one restoring member, abutting between the pressing element and the grip element;
an escape space, defined in the second end portion of the extension element, and communicating with the guide arc portion;
at least one first recessed portion, disposed at the second end portion, connected to the escape space and the guide arc portion, and extending from the guide arc portion to a location where the grip element and the second end portion of the extension element are pivoted;
at least one second recessed portion, disposed at the second end portion, connected to the escape space and the guide arc portion, and extending from the guide arc portion to the location where the grip element and the second end portion of the extension element are pivoted, the first recessed portion and the second recessed portion being perpendicular to each other;
at least one stop portion, defined between the first recessed portion and the second recessed portion, and adjacent to the guide arc portion; and
at least one locking portion, disposed at the pressing element, extending toward the location where the grip element and the second end portion of the extension element are pivoted, and adapted to move with the pressing element;
wherein when the locking portion is locked to one of the first recessed portion and the second recessed portion, the stop portion is located on a moving path of the locking portion and stops the locking portion to change the position of the grip element relative to the connection assembly, and when a force is applied to the pressing element to deform the restoring member, the locking portion moves into the escape space from the one of the first recessed portion and the second recessed portion, and the stop portion moves out of the moving path of the locking portion, so that the grip element is adapted to rotate relative to the extension element.

10. An electronic device casing, comprising:
a body;
a movable apparatus, adapted to be assembled on the body; and
a handle extension structure, comprising:
a connection assembly, comprising a first end and a second end opposite to each other, and adapted to be pivoted on the movable apparatus; and
an operation assembly, slidably disposed at the connection assembly, the operation assembly comprising:
an extension element, comprising a first end portion and a second end portion opposite to each other, the first end portion being slidably disposed between the first end and the second end; and
a grip element, pivoted to the second end portion;
wherein when the first end portion of the extension element is located at the first end, a portion of the grip element is located in the connection assembly, a total length of the connection assembly and the operation assembly is a first length, and the second end portion is located between the first end and the second end; and
when the first end portion slides to the second end to locate the grip element outside the connection assembly, the total length of the connection assembly and the operation assembly is a second length, the second end portion moves out of the second end, and the grip element is adapted to rotate relative to the second end portion, the second length being greater than the first length.

11. The electronic device casing according to claim 10, wherein the connection assembly comprises a body portion, at least one first slot arm, at least one second slot arm, and at least one positioning portion, the body portion comprises the first end and the second end opposite to each other, the first slot arm extends from the first end to the second end, the second slot arm extends from the second end to the first end, a sliding slot is defined among the body portion, the first slot arm and the second slot arm, the first slot arm and the second slot arm are opposite to each other and are separated by a gap, the gap communicates with the sliding slot, and the positioning portion is connected to one of the first slot arm and the second slot arm and is located beside the gap;

wherein the extension element further comprises at least one sliding block, the at least one sliding block protrudes from the first end portion and is slidably disposed at the sliding slot, and the positioning portion is adapted to abut against the sliding block to position the operation assembly relative to the connection assembly.

12. The electronic device casing according to claim 10, wherein a first inner diameter of the connection assembly is equal to a first outer diameter of the first end portion of the extension element, and a second outer diameter of the grip element is equal to a first outer diameter of the connection assembly.

13. The electronic device casing according to claim 12, wherein a third outer diameter of the second end portion of the extension element is equal to a second inner diameter of the grip element.

14. The electronic device casing according to claim 12, wherein the operation assembly further comprises a protrusion element, and the protrusion element is located at an end of the grip element opposite to a location where the grip element is pivoted to the second end portion, a fourth outer diameter of the protrusion element being greater than the second outer diameter of the grip element.

15. The electronic device casing according to claim 10, wherein the handle extension structure further comprises:
a positioning structure, configured to change a position of the grip element relative to the connection assembly.

16. The electronic device casing according to claim 15, wherein the positioning structure comprises:
at least one positioning block, disposed at the grip element; and
at least one positioning slot, disposed at the connection assembly, and adapted to receive the positioning block to change the position of the grip element relative to the connection assembly.

17. The electronic device casing according to claim 15, wherein the positioning structure comprises:
at least one guide arc portion, disposed at the second end portion of the extension element; and
at least one pressing element, disposed at the grip element and movably penetrating the guide arc portion, so that the grip element is selectively adapted to rotate relative to the second end portion.

18. The electronic device casing according to claim 17, wherein the pressing element is slidably disposed at the grip element, and the positioning structure further comprises:
at least one restoring member, abutting between the pressing element and the grip element;
an escape space, defined in the second end portion of the extension element, and communicating with the guide arc portion;
at least one first recessed portion, disposed at the second end portion, connected to the escape space and the guide arc portion, and extending from the guide arc portion to a location where the grip element and the second end portion of the extension element are pivoted;
at least one second recessed portion, disposed at the second end portion, connected to the escape space and the guide arc portion, and extending from the guide arc portion to the location where the grip element and the second end portion of the extension element are pivoted, the first recessed portion and the second recessed portion being perpendicular to each other;
at least one stop portion, defined between the first recessed portion and the second recessed portion, and adjacent to the guide arc portion; and
at least one locking portion, disposed at the pressing element, extending toward the location where the grip element and the second end portion of the extension element are pivoted, and adapted to move with the pressing element,
wherein when the locking portion is locked to one of the first recessed portion and the second recessed portion, the stop portion is located on a moving path of the locking portion and stops the locking portion to change the position of the grip element relative to the connection assembly, and when a force is applied to the pressing element to deform the restoring member, the locking portion moves into the escape space from the one of the first recessed portion and the second recessed portion, and the stop portion moves out of the moving path of the locking portion, so that the grip element is adapted to rotate relative to the extension element.

* * * * *